(12) United States Patent
Muirhead et al.

(10) Patent No.: US 7,170,747 B2
(45) Date of Patent: Jan. 30, 2007

(54) PLUG-IN RACK

(75) Inventors: Andrew Muirhead, Norderstedt (DE); Henry Starke, Ellerbek (DE)

(73) Assignee: Lufthansa Technik AG, Hamburg (DE)

( * ) Notice: Subject to any disclaimer, the term of this patent is extended or adjusted under 35 U.S.C. 154(b) by 264 days.

(21) Appl. No.: 10/474,685

(22) PCT Filed: Apr. 12, 2002

(86) PCT No.: PCT/EP02/04093

§ 371 (c)(1), (2), (4) Date: May 13, 2004

(87) PCT Pub. No.: WO02/085088

PCT Pub. Date: Oct. 24, 2002

(65) Prior Publication Data
US 2004/0201967 A1    Oct. 14, 2004

(30) Foreign Application Priority Data
Apr. 12, 2001 (EP) .................................. 01109194

(51) Int. Cl.
H05K 7/20 (2006.01)
A47G 29/00 (2006.01)
(52) U.S. Cl. .................. 361/715; 361/690; 312/265.1; 312/265.5
(58) Field of Classification Search ................ 361/716, 361/690, 692; 312/265.1–265.6
See application file for complete search history.

(56) References Cited

U.S. PATENT DOCUMENTS 1,116,304 A * 11/1914 Lundstrome ................ 312/108
2,871,457 A    1/1959 Jencks et al.
3,541,395 A * 11/1970 Lucchino .................... 361/693
4,021,089 A *  5/1977 Bush ......................... 312/265.5

(Continued)

FOREIGN PATENT DOCUMENTS

EP    0 049 517 A2    4/1982

(Continued)

OTHER PUBLICATIONS

English Translation of International Preliminary Examination Report for PCT/EP02/04093 dated May 23, 2003.

*Primary Examiner*—Michael Dalskovsky
*Assistant Examiner*—Robert J. Hoffberg
(74) *Attorney, Agent, or Firm*—Morrison & Foerster LLP

(57) ABSTRACT

A mounting rack for aircraft has one or more rows, which are located one above the other, each having one or more compartments which are located alongside one another, for holding electronics units, with a compartment being designed for independent insertion and withdrawal of an electronics unit. The compartment in each case is associated with a first electrical plug connector, such that the first plug connector can interact with the corresponding second plug connector of an electronics unit solely as a result of the insertion of the electronics unit into the compartment. A set of components includes base parts, cover parts, side parts and rear parts and first electrical plug connectors, can be arranged in rows as required, according to the invention, such that this results in a standard mounting rack with any desired number of compartments which are arranged one above the other and alongside one another, and with the rear parts each being designed for connection to the corresponding first plug connector or connectors.

19 Claims, 5 Drawing Sheets

U.S. PATENT DOCUMENTS

| | | |
|---|---|---|
| 4,089,040 A | 5/1978 | Paulsen |
| 4,123,129 A * | 10/1978 | Butler .................... 312/265.3 |
| 4,153,225 A * | 5/1979 | Paulsen .................. 244/118.1 |
| 4,265,501 A * | 5/1981 | Halliburton ................ 312/108 |
| 4,458,296 A * | 7/1984 | Bryant et al. .............. 361/691 |
| 4,549,602 A * | 10/1985 | Espinoza .................. 165/80.2 |
| 5,305,187 A | 4/1994 | Umezu et al. |
| 5,400,217 A * | 3/1995 | Whitson et al. ............ 361/695 |
| 5,700,342 A * | 12/1997 | Giannetti .................... 156/245 |

FOREIGN PATENT DOCUMENTS

| | | |
|---|---|---|
| WO | WO 98/47334 | 10/1998 |

\* cited by examiner

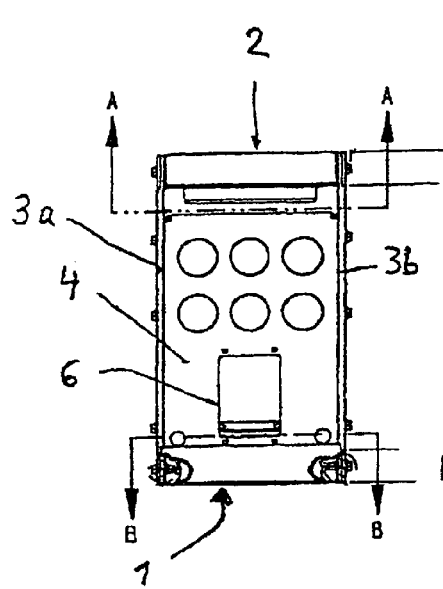
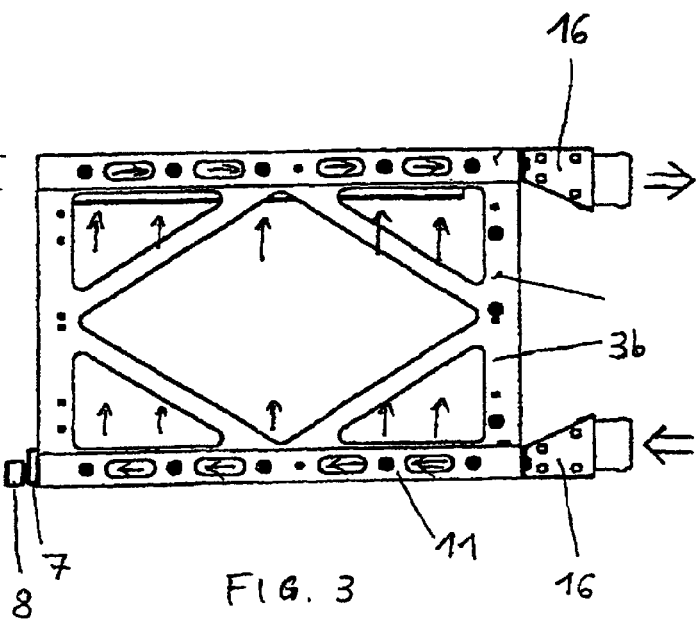
FIG. 2
FIG. 3
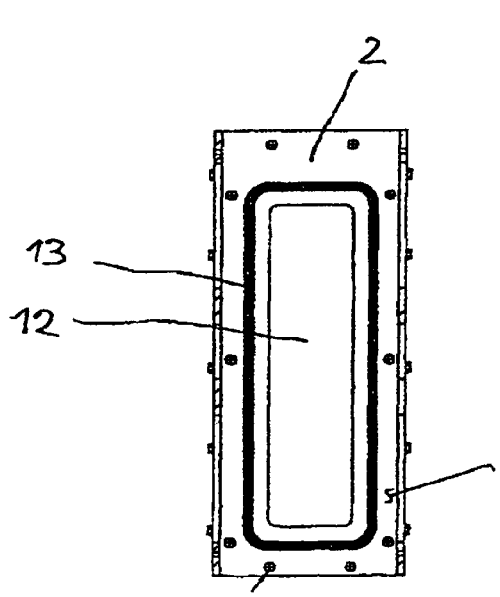
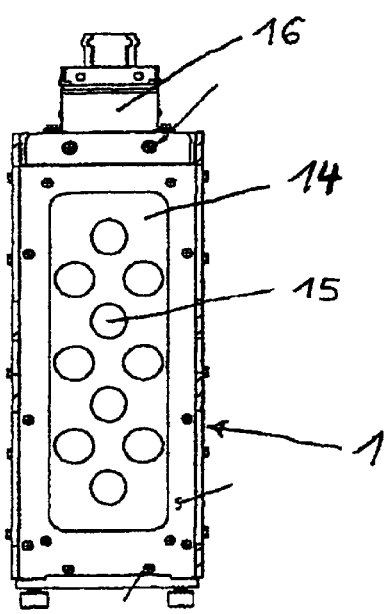
A-A
B-B
FIG. 4
FIG. 5

PLUG-IN RACK

FIELD AND BACKGROUND OF THE INVENTION

The invention relates to a mounting rack for aircraft, which has one or more rows, which are located one above the other, each having one or more compartments, which are located alongside one another, for holding electronics units, with a compartment being designed for independent insertion and withdrawal of an electronics unit. A compartment in each case has an associated first electrical plug connector, such that the first plug connector can interact with the corresponding second plug connector of an electronics unit solely as a result of the insertion of the electronics unit into the compartment.

A mounting rack such as this is provided, for example, in what is referred to as the E/E area of the aircraft underneath the cock-pit, and is used for accommodating electronics units (which are referred to as LRUs, line replaceable units). There are a number of specifications (for example ARINC, Lufthansa Technik XXL) in existence for electronics units and mounting racks. It is known for the first electrical plug connector to be provided on an L-shaped component, the so-called tray, with the tray being formed from a base part and rear part. The first plug connector is part of an adapter which is incorporated into the rear wall. In use, the tray is firmly connected to the base of a compartment of the mounting rack. At the rear, the adapter is connected to the corresponding connecting lines. The interior of the tray, that is to say the cuboid volume defined by the L-shape is designed to accommodate an electronics unit. On its rear face, this electronics unit has a corresponding second plug connector. The first plug connector is arranged such that the electrical connection is produced solely as a result of the electronics unit being inserted into the compartment, without any additional action being required. This allows the electronics units to be replaced in the shortest possible time. The electronics units are housed in the mounting rack by locking devices (so-called hold downs). The configuration of the tray as a separate component allows it to be disconnected with the adapter from the mounting rack, and the tray to be replaced by another. This may, for example, be necessary when the adapter is defective.

Mounting racks with a specific overall size are known, for example, from U.S. Pat. Nos. 2,871,457 and 5,441,337. Two or more electronics units which may have different height or width dimensions may be inserted into these known mounting racks. The internal subdivision of the mounting rack can be changed for matching to the different dimensions. No provision is made for matching of the external dimensions.

Furthermore, mounting racks are known in which inserts with a fixed width can be inserted (for example U.S. Pat. No. 5,441,337). These normally have a width of 19 inches (so-called 19-inch racks). The inserts for such mounting racks likewise in a corresponding manner have a fixed width, normally of 19 inches. Insert for a 19-inch rack are known, for example, from U.S. Pat. No. 4,014,598, EP-A-0 560 067 and DE-A-3409022. Single rails are arranged in the inserts, in order to accommodate electronics boards. These so-called 19-inch systems have the disadvantage that they offer flexibility only with respect to the subdivision of the interior. The external dimensions are governed by the rack itself and cannot retrospectively be modified or adapted. Even if the 19-inch rack is constructed from individual elements, as described in U.S. Pat. No. 5,441,337, there is no provision for individual elements to be replaced in the installed state. Matching to different installation conditions is thus impossible, or is feasible only with difficulty.

Housing systems for accommodating inserts, in which an electrical plug connection is produced automatically during insertion of the insert, are already known per se (U.S. Pat. Nos. 4,977,532 and 4,967,311). However, these likewise have fixed dimensions and it is thus impossible to match them to different installation conditions.

The known mounting racks must therefore be designed from the start to correspond to the respective installation conditions in the aircraft type. A specific mounting rack is therefore also required for each different aircraft type. This is costly in terms of manufacture and storage.

SUMMARY OF THE INVENTION

The object of the invention is to provide a more universal system, in which the cost for producing mounting racks of the type mentioned initially is reduced, and/or the number of parts that need to be stored is reduced.

For this purpose, the invention proposes a set of components, essentially comprising flat rack parts, that is to say base parts, cover parts, side parts and rear parts, and first electrical plug connectors, which can be connected to form a compartment for independent insertion and withdrawal of an electronics unit which is provided with a second electrical plug connector, such that two or more compartments which are located one above the other or alongside one another form a standard mounting rack, with the compartments each being associated with one of the first electrical plug connectors, such that the first plug connector can interact with the corresponding second plug connector of an electronics unit solely as a result of the insertion of the electronics unit into the compartment, with, according to the invention, the rack parts being designed such that they can be arranged in rows as required, such that the standard mounting rack has any desired number of compartments which are arranged one above the other and alongside one another, and the rear parts are each designed for connection to the corresponding first plug connector or connectors.

First of all, some of the terms that are used will be explained.

The terms electronics unit and (electronics) insert are used synonymously.

In principle, a set of components is a number of components which can be used to form a mounting rack according to the invention. The invention also covers a set of components which is not complete in this sense where the use is defined according to the invention. "Located on above the other" and "located alongside one another" should not be understood as meaning that a mounting rack must have at least two (horizontal) rows of compartments, or that each row must have at least two compartments. For example, the invention also covers a mounting rack with only one row of compartments (a so-called shelf). In general, a mounting rack will have at least two, and preferably at least three, rows of compartments which can be connected to one another. The terms "located one above the other" and "located alongside one another" are intended to indicate that a mounting rack in general has a structure of rows and columns like a matrix.

A standard mounting rack is a mounting rack in which all the rack parts are connected to the mounting rack, and which complies with the load requirements that occur in an aircraft. The entire mounting rack should thus withstand, for example, accelerations of up to 10 g without any problems when in the completely installed state.

The design of a compartment for "independent insertion and withdrawal" of an electronics unit means that an electronics unit can be replaced without influencing or adversely affecting the mounting rack and/or any further electronics unit possibly inserted. This necessarily means that an electronics unit or parts of such an electronics unit cannot be part of the mounting rack. This is the only way to ensure rapid and independent replacement of any desired electronics unit.

The electrical supply for an electronics unit which has been inserted into a compartment and the signal transmission from and to the electronics unit are respectively provided via a first plug connector and a second plug connector, which are designed to interact with one another. The second plug connector is in each case arranged on the electronics unit, while the first plug connector is connected at the rear to the corresponding supply and/or signal lines. The feature of the interaction of first and second plug connectors that correspond to one another can be achieved solely as a result of the insertion of the electronics unit into the compartment means that the electrical contact is produced automatically during the insertion process without any additional action being required. This may be accomplished, for example, by the second plug connector being spatially fixed relative to the compartment, to be precise with the plug opening oriented in the opposite direction to the insertion direction. The spatial fixing provides sufficient resistance against the forces which act on the second plug connector as a result of the insertion process. The plug connectors are preferably designed such that this resistance is low (low or zero insertion force). The plug connectors preferably have guide surfaces which interact with one another and ease the insertion process.

"Essentially flat" means that the rack parts on average have an extent in one spatial direction which is less by a factor of at least 3, preferably at least 5 and furthermore preferably at least 7 than in the two other spatial directions. The specific shape of a rack part is of minor importance in this case. Furthermore, the factor that has been mentioned is preferably at least 10 and furthermore preferably at least 20 for the side and/or rear parts. The L-shaped trays from the prior art, in particular, are not flat in the sense that has been mentioned. Flat rack parts are advantageous, for example, with regard to storage.

The feature that the width of a rack part in each case corresponds to the width of a compartment should not be understood as meaning that the width of the rack part need be exactly equal to the width of the corresponding compartment. This feature means only that the width of the rack parts does not in each case extend essentially over two or more compartments.

According to one preferred feature of the invention, the height of at least some of the rear parts in each case corresponds to the height of a compartment, and the rear parts are each designed for connection to the corresponding first plug connector or connectors. This means that the first plug connectors are connected to the mounting rack without any intermediate parts when in the operating state. In comparison to the prior art, this means that there is no need for separate intermediate pieces such as L-shaped trays. The prior art requires a separate intermediate piece between the mounting rack and the first electrical plug connector in order to allow an individual first plug connector to be replaced independently of the mounting rack. This replacement capability is provided for the purposes of the invention from the fact that the height of the rear part corresponds to the respective compartment.

The invention has identified the fact that the breakdown of in each case one row of compartments into rack parts whose width is in each case matched to the smallest envisaged unit, namely a compartment, ensures increased flexibility, while at the same time reducing the number of parts required. In particular, mounting racks each having a desired number of compartments, which are located alongside one another, can be formed in each row and/or with rows which in each case have any desired width. The invention makes it possible to produce a mounting rack with any desired number of rows, each having any desired number of compartments, which are located alongside one another, in each row. Overall, this leads to a modular configuration of the mounting rack, whose width and height can be individually matched to the respective conditions. In order to replace a first plug connector, it is sufficient simply to remove the rear part that corresponds to that compartment, independently of the other first plug connectors. The invention reduces the cost for production and storage of the corresponding rack parts. In comparison to this, a large number of parts would need to be provided in the prior art which, on the one hand, are matched both to the respective aircraft type and to the respective installation location for each aircraft type. The parts which are provided for one aircraft type and for one specific installation location can in general not be used for any other installation location or even for any other aircraft type.

BRIEF DESCRIPTION OF THE DRAWINGS

The reduction in the number of different parts which need to be stored in order to form a mounting rack according to the invention follows from the fact that essentially only a range of base parts, cover parts and rear parts corresponding to the number of desired widths of the compartments and, frequently, only a single side part type maybe provided for rack parts of a specific height and depth.

This is based on the knowledge that the widths of the electronics units for international air transport are standardized. The standard widths follow a system with a module A, which is referred to as ATR, and is subdivided into a finer grid size, which follows a basic module a (normally referred to as MCU), where A is an integer multiple of a. These units are not in each case defined exactly, but only within specific fluctuation ranges. Furthermore, the ATR/MCU scale is not linear. The height of the electronics units is generally fixed, although inserts are also used whose height is greater than or less than the standard height. In the same way as the width, the heights are likewise in each case based on a scheme relating to a module and a basic module. The depth of the inserts is generally defined, although different dimensions may, however, likewise occur. The invention is not restricted to electronics units with a single height and/or width. In addition, rack parts of a greater width may be provided in order to allow mounting racks with greater widths to be produced economically. The expression "an integer multiple" means any desired natural number, including the number one.

DETAILED DESCRIPTION OF THE INVENTION

Figure 1:
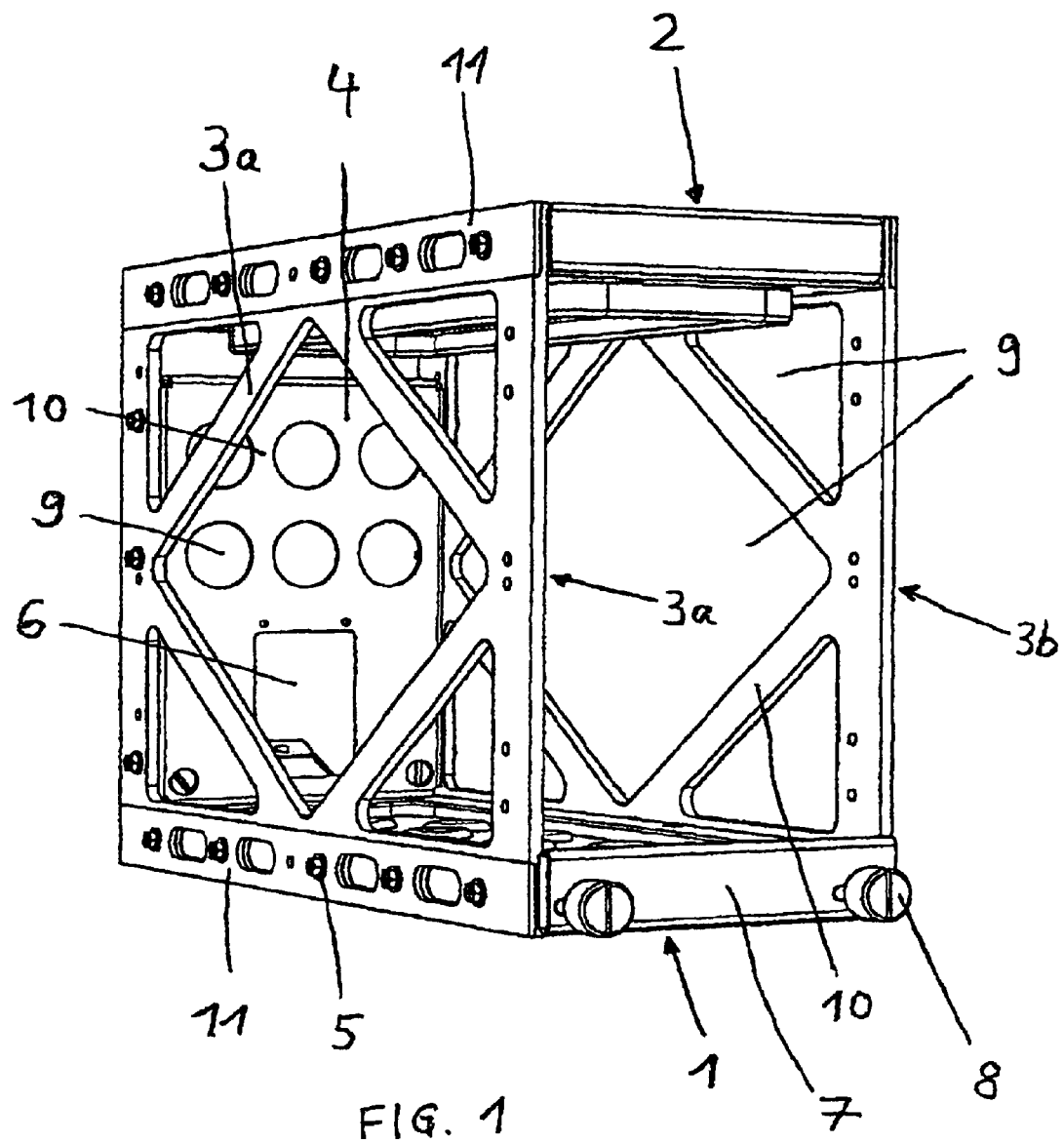

The rack parts preferably have dimensions such that the width and/or the height of the compartments are/is an integer multiple of a module A, and additional rack parts are provided whose dimensions differ by an integer multiple of a basic module a, with the module A being an integer multiple of the basic module a. In one proven system, A is equal to 8×a. A in this case represents a distance of about 256 mm, corresponding to about 10.1 inches.

The rack parts are preferably designed to be detachably connected to one another. These are connections which can be detached again without any adverse affect on the rack parts and without any subsequent need, for example, for cleaning of the rack parts. This may be achieved, for example, by means of screw connections. In contrast, adhesively bonded connections are not included in this advantageous embodiment. If the connections of the frame parts are detachable, a mounting rack can be disassembled and can be installed elsewhere. In more general terms, matching to changing spatial conditions can be carried out at any time.

One advantageous development of the invention relates to the cooling of electronics units which have been inserted into the mounting rack, by means of a coolant, in particular a cooling airflow. Where the following text refers to cooling air, this expression is also intended to cover other fluid, in particular gaseous coolants. Provision is accordingly advantageously made for cooling air chambers to be completely integrated in the rack parts which form the mounting rack, and for each of them to have one or more cooling air openings which point into the interior of a compartment. Since the cooling air chambers are completely integrated in the rack parts which form the mounting rack, there is no need for any separate cooling air lines within the mounting rack. A cooling air chamber is expediently designed to be connected to cooling air lines, which are connected to an appropriate coolant source.

It is particularly advantageous for the flat extent of a cooling air chamber to correspond at most approximately to the dimensions of a corresponding compartment. This embodiment complies with the basic idea for modularity of the mounting rack. For example, this means that it is possible to remove a compartment without this having any adverse effect on the cooling of the other compartments. This would be the situation if a cooling air chamber were to extend over two or more compartments, so that removal of one compartment could interrupt the supply to adjacent compartments. Accordingly, a cooling chamber is expediently integrated in each individual rack part. In this case, this is preferably a base part and/or a cover part.

In addition to having at least one associated pressure opening for the cooling air supply, a compartment advantageously also has at least one associated suction opening for extraction of exhaust air, in order that heated coolant does not remain in the area of the mounting rack, which could detract from the overall cooling effect. An exhaust air chamber is expediently designed for connection to exhaust air lines, which are connected to devices for producing a reduced pressure. The exhaust air chamber is referred to as a cooling air chamber that is provided with a suction opening, and the supply air chamber is correspondingly referred to as a cooling air chamber which is provided with a pressure opening. The supply air and exhaust airlines are preferably connected in a closed circuit, which may be connected to the aircraft cooling systems. In one form of cooling which may be used, for example, some of the cooling air circuit is routed along the outer skin of the aircraft, which is cold when the aircraft is in flight.

The pressure and suction openings are advantageously arranged opposite one another with respect to the particular compartment, for example respectively being arranged in the corresponding base part and cover part, in order to produce a coolant flow in a uniform direction.

A metering plate is preferably provided in order to regulate the cooling air flow for a cooling air opening. A metering plate is expediently connected to the corresponding cooling air chamber, or to its opening which points towards the interior of the compartment, such that it is sealed. The metering plate has metering devices. These may simply be openings of a specific diameter in the metering plate. All the supply air chambers can then have a standard, sufficiently high pressure applied to them; the cooling airflow rates which are desirable for each compartment can be set individually with the aid of the appropriate metering plate. Closure elements, for example rubber plugs, are advantageously provided for that purpose and are used to open and close a number of metering openings which are provided in the metering plate, and with the number of these openings that are opened and closed being matched to the respective conditions (these metering openings should in general be aligned with corresponding coolant openings in the housing of an inserted LRU). There is then no need to in each case provide metering plates with a different number of metering openings, thus contributing to the reduction in the number of parts.

Mutually corresponding metering plates are preferably provided for two mutually opposite supply and exhaust air openings for one compartment. This is helpful for producing a direct, uniform cooling air flow.

Carbon fiber is preferably used as the material. Carbon fiber has the advantage of being extremely light, with extraordinary strength. Both characteristics are advantageous with regard to the requirements that exist in the field of aviation. The strength is particularly important for the components set according to the invention, since a mounting rack that is produced from them must hold the electronics units accommodated in it securely even when subjected to high loads, for example in turbulence. Furthermore, even only minor movements of the electronics units can lead to contact difficulties and thus to failure of the corresponding system. It should also be remembered that some of the electronics units are quite heavy so that it is even more important for the components to have a correspondingly high strength. Carbon fiber is thus a preferred material. Furthermore, carbon fiber has the advantage that it is electrically nonconductive and, furthermore, is also nonmagnetic. The latter may be important in particular for navigation systems, especially for remote compass systems.

The invention is a modular aircraft mounting rack made up of flat rack parts including base parts, cover parts, side parts, rear parts and first electrical plug connectors. The rack parts are designed such that they can be connected to form a drawer for independent insertion and withdrawal of an electronics unit which is provided with a second electrical plug. The mounting rack is formed by combining two or more of the drawers which are located one above the other or alongside one another, each of the drawers each being associated with one of the first electrical plug connectors so that each first plug connector interacts with the corresponding second plug connector of an electronics unit solely as a result of the insertion of the electronics unit into the drawer. The rack parts are designed so that they can be arranged in rows as reciuired, in order to give the mounting rack has a predetermined number of drawers which are arranged one above the other or alongside one another, with the rack parts being designed to be detachably connected to one another. The rack parts have dimensions such that the widths or the heights of the drawers are integer multiples of a module A, and can include additional rack parts whose dimensions differ by an integer multiple of a basic module A, with the module A being an integer module of the basic module A. The rear parts are each designed for connection to the corresponding first plug connector or connectors. Where the invention as described herein has technical features which relate to the mounting rack in the assembled state, a component set satisfies these claimed features if they occur once the component set has been assembled correctly. The invention also covers a mounting rack which can be produced by assembly of a component set according to the invention.

Figure 6:
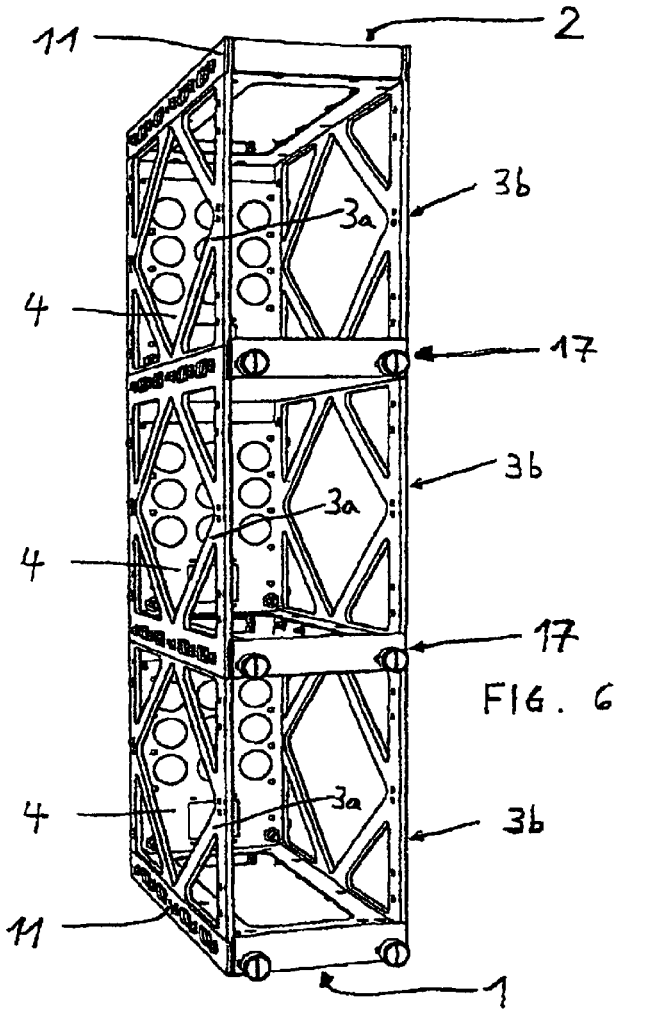
Figure 7:
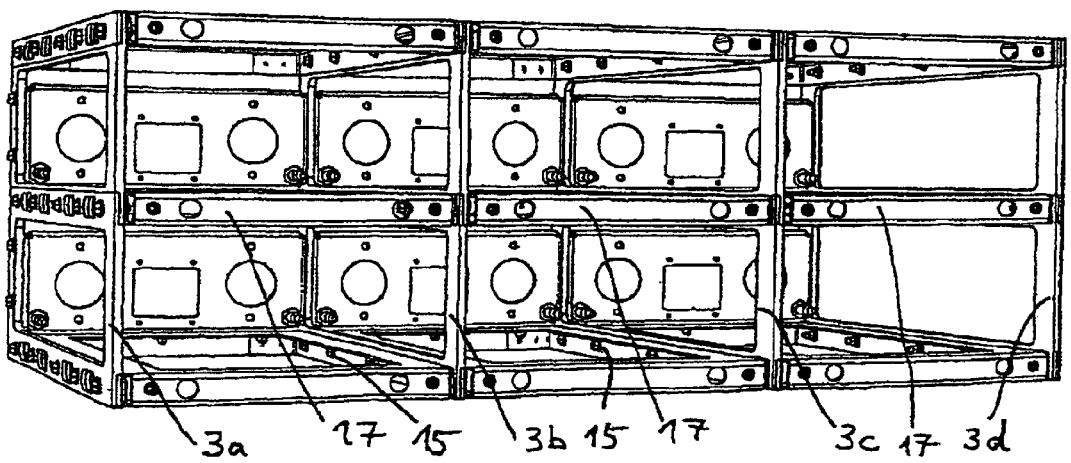
Figure 8:
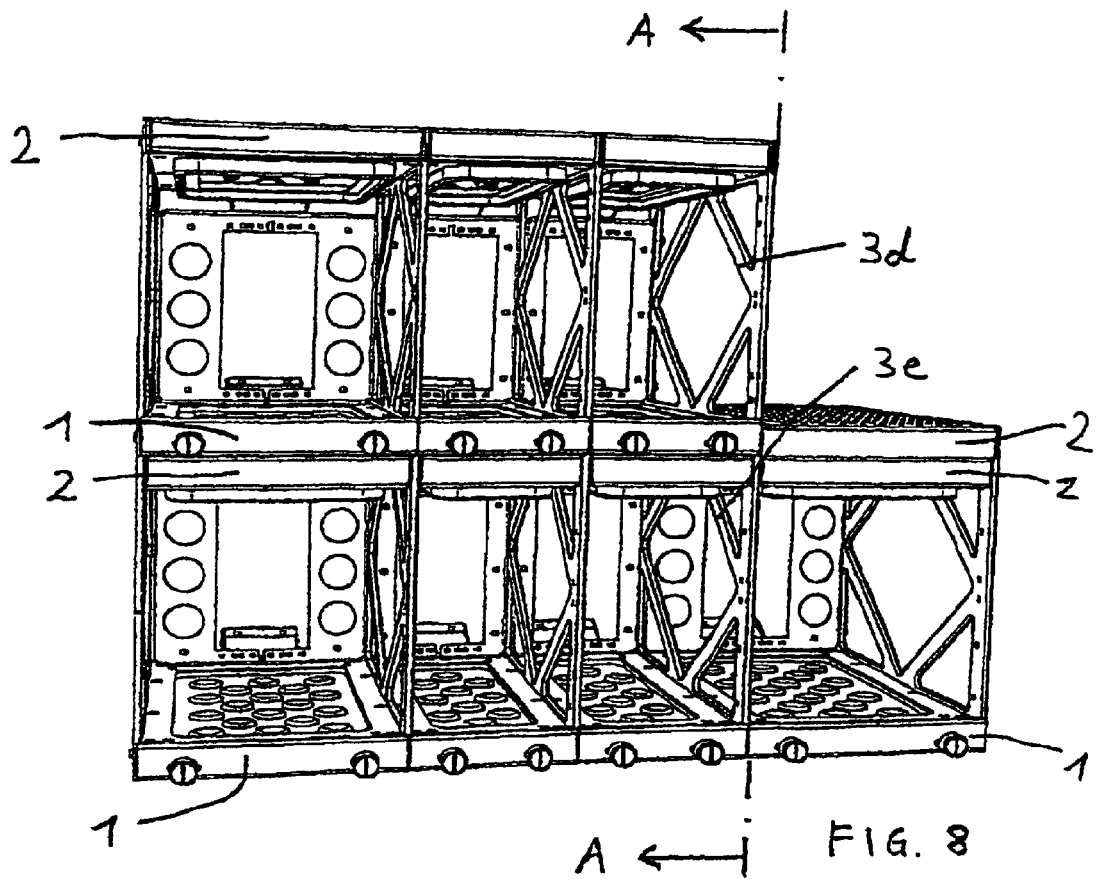
Figure 9:
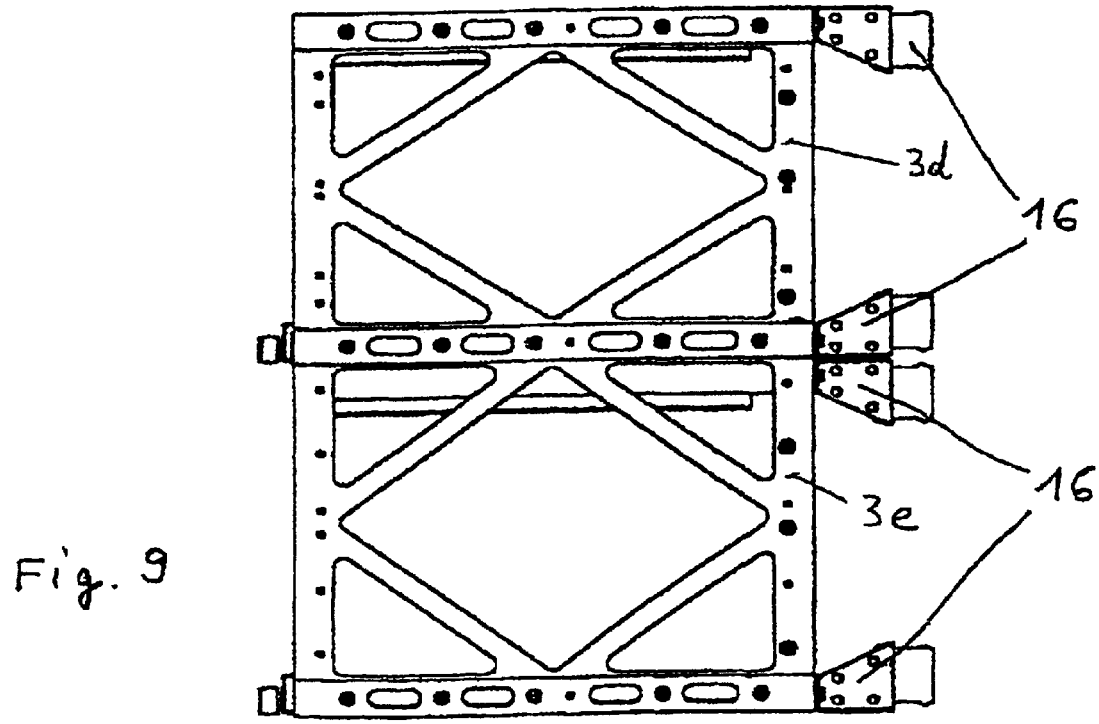
Figure 10:
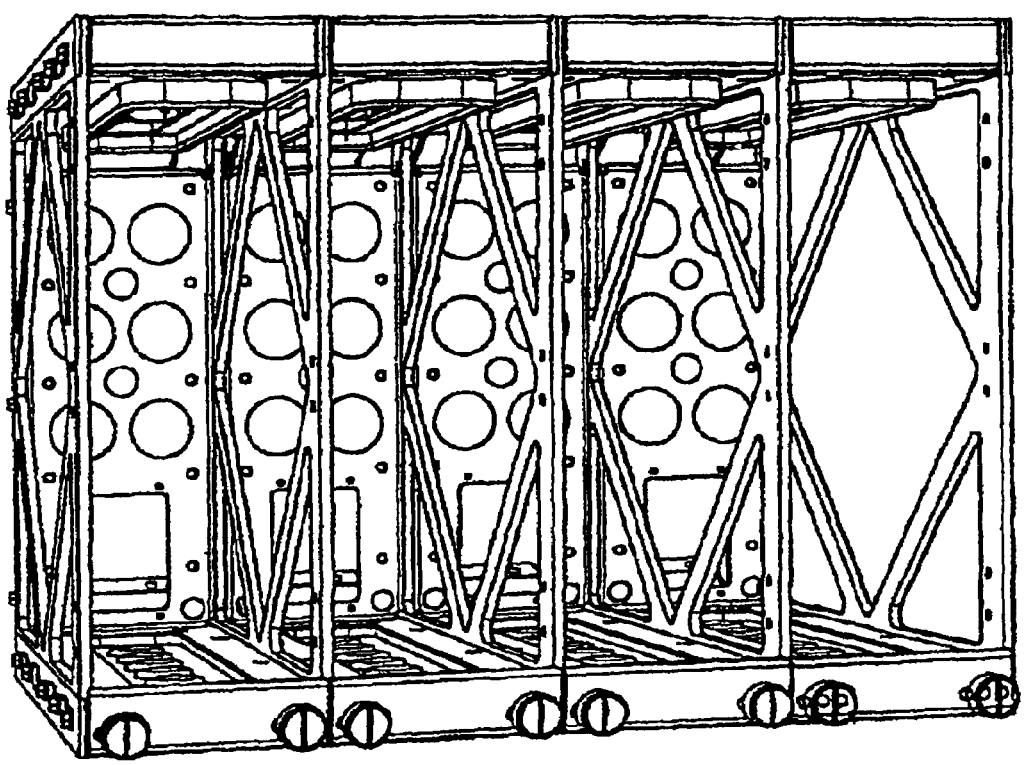

The invention will be explained in the following text using advantageous exemplary embodiments and with reference to the attached figures, in which:

FIG. 1 shows a perspective view of a first mounting rack according to the invention, FIG. 2 shows a view of the mounting rack shown in FIG. 1 from the front, FIG. 3 shows a view of the mounting rack shown in FIG. 1 from the right, FIG. 4 shows a view A—A of the mounting rack shown in FIG. 2, FIG. 5 shows a view B—B of the mounting rack shown in FIG. 2, FIG. 6 shows a perspective view of a second mounting rack according to the invention, FIG. 7 shows a perspective view of a third mounting rack according to the invention, FIG. 8 shows a perspective view of a fourth mounting rack according to the invention, FIG. 9 shows a view A—A of the mounting rack shown in FIG. 8, and FIG. 10 shows a perspective view of a fifth mounting rack according to the invention.

The mounting rack which is shown in FIG. 1 comprises a single compartment and is formed by a base part 1, a cover part 2, two side parts 3a, 3b and a rear part 4. The rack parts 1, 2, 3, 4 are detachably connected to one another with the aid of screws 5. The frame parts 1, 2, 3, 4, which are connected to one another, form a compartment into which an electronics unit with a standard width of ½ ATR (4 MCU) can be inserted from the front. The rear wall 4 has an opening 6 at some suitable point, which is designed to accommodate an electrical adapter. The inserted adapter is firmly connected to the rear wall 4. The adapter, which is not shown in the figures, forms a first electrical plug connector on the front face of the rear wall 4, that is to say the face which is oriented towards the compartment. An electronics unit which can be inserted into the compartment has a second electrical plug connector at some suitable point. During insertion of the insert, the second plug connector is guided into the first plug connector, so that the two plug connectors make electrical contact once inserted. On the side facing away from the compartment, the adapter once again forms an electrical plug connector, which interacts with a corresponding plug connector that is connected to electrical supply and/or signal lines.

An insert which has been inserted is fixed with the aid of a lip 7 which extends essentially over the entire width of the compartment and, when in the locked state as shown in FIG. 1, projects upwards beyond the lower face of the compartment, thus preventing any movement of the insert in the opposite direction to the insertion direction, by means of the stop on the lip 7. The lip 7 is secured with the aid of two screws 8. In order to release the lock, the screws 8 are undone, following which the lip 7 can be folded downwards; in this open state, the lip 7 and the screws 8 are held captive on the mounting rack. The described design, in particular the use of a flat holding lip 7, allows a physical depth which is less than that with the prior art (see FIGS. 3, 5). Since the locking device 7, 8 no longer projects as far, this results in less space being required, overall.

The rack parts, in particular the side parts 3a, 3b and the rear part 4, have installation openings 9. Cables or guide devices, for example, can be attached to the corresponding webs 10.

The strips 11 are used for filling corresponding grooves in the side parts 3a, 3b, whose function will be explained later.

The weights of all the components are optimized. For example, the rack parts 1, 2, 3, 4, 7, 11 are preferably composed of aluminum or an aluminum alloy. A further preferred material is carbon fibers.

The cooling will be explained in the following text, in particular with reference to FIGS. 2 to 5. The cover part 2 encloses a hollow chamber, which extends approximately over the entire extent of the cover panel 2. This has a cooling air opening 12, which points downwards, that is to say towards the compartment, with a seal 13. A flow metering plate 14 is attached and screwed to the lower face of the cover part 2, in order to cover the opening 12. The metering plate 14 contains metering openings 15, in this case circular holes. Individual holes 15 can be closed by rubber plugs, which are not shown here, in order to allow deliberate regulation of the airflow.

A corresponding situation applies in the same sense to the base part 1. This also preferably has a flow metering plate 14, which is fitted such that it is sealed. The opening 12 in this case points upwards.

The base part 1 and the cover part 2 each have an opening on their rear face, and these openings are each connected to a connecting piece 16, preferably such that they are sealed. At its end which faces away from the mounting rack, the connecting piece 16 is designed for connection to lines (which are not shown), for example flexible tubes, for supplying and carrying away the cooling air. Cooling air is introduced via the connecting piece 16 (which is associated with the base part 1) into the cooling air chamber in the base part 1, and flows through the opening 12 and through the metering openings 15 into the interior of the compartment. The cooling air flows through an electronics unit which may be inserted in the compartment. The connecting piece 16 which is associated with the cover part 2 has reduced pressure applied to it at its end facing away from the compartment, so that the heated exhaust air which emerges from an electronics unit which may be inserted is sucked out through the corresponding opening 12 and the metering openings 15 into the cooling air chamber in the cover part 2, and from their through the connecting piece 16. The connecting pieces 16 which are associated with the base part 1 and the cover part 2, are preferably connected in the sense of a cooling air circuit, which can be connected to the cooling systems which are always provided in aircraft, in order to cool the cooling air there. By way of example, parts of the cooling circuit may be routed along the outer skin of the aircraft. The connecting pieces 16 can preferably be used universally on any desired base and/or cover part. In this case, there is only a single type of connecting piece 16, thus further reducing the wide range of parts. The connecting pieces 16 are, in particular designed to be flattened on one side, so that, when the base part or cover part is connected, they are aligned with its outer face, or in any case do not project beyond it. When two or more compartments are located one above the other, this prevents the connecting pieces 16 from colliding with one another (see FIG. 9).

FIG. 6 shows a mounting rack with three compartments, which are arranged one above the other, for inserts which each have a width of ½ ATR (4 MCU). The side parts 3a, 3b are designed to be connected to one another in the manner of tongue and groove connections. For this purpose, at their lower and upper ends, they have grooves which extend over their entire length. The grooves engage alternately in one another, in which case, for example in the case of the central side part 3a in FIG. 6, the grooves point inwards while, in contrast, those on the upper and lower side parts 3a point outwards. This configuration means that a single type of side part 3a, 3b is sufficient for the present exemplary embodiment. The grooves in the side parts 3a, 3b at the upper and lower ends of the mounting rack are closed by strips 11. By way of example, in the embodiment shown in FIG. 6, the cover part for the lower compartment at the same time forms the base part of the central compartment. This intermediate part 17 is accordingly associated with both the lower and the central compartment and, in a corresponding manner, has both a cooling air opening 12 which points downwards and a cooling air opening 12 which points upwards. Both cooling air openings 12 are preferably provided with flow metering plates 14. The intermediate part 17 is designed to be connected by its rear face to only one connecting piece 16 The cooling configuration in FIG. 6 may, for example, appear as follows. A cooling air flow with a magnitude j is introduced into the base part of the lower compartment. An exhaust air flow with a magnitude 2j is sucked out from the intermediate base 17 located above it. A cooling airflow with a magnitude 2j is introduced into the intermediate base located above this. An exhaust air flow with the magnitude j is sucked out of the cover part 2 on the upper compartment. This results in the same airflow with the magnitude j flowing through all the compartments. The desired cooling air flow can be set individually for each compartment with the aid of the already mentioned closure plugs for the metering openings 15.

The use of an intermediate base 17 instead of a separate base part 1 and cover part 2 leads to the physical height being reduced overall.

FIG. 7 shows a mounting rack with two rows each having three compartments for video units whose width is ¾ ATR (6 MCU) and whose height is less than the height of the compartments shown in FIGS. 1, 6, 8. The statements made with regard to FIG. 6 apply in a corresponding manner to the tongue and groove connection of the side parts and to the use of intermediate bases 17. The central side parts 3b, 3c are respectively associated with compartments that are located to the right and left of them. There is therefore no need to provide two separate side parts for each compartment. This leads to reduced complexity and to the overall width being reduced. The rack parts 1, 2, 3, 4, 17 are connected to one another with the aid of screws or threaded bolts 15 which engage over them.

FIG. 8 shows a mounting rack with a lower row of four compartments with widths of six, four, four and six MCU, and a row of three compartments located above this, with widths of six, four and four MCU. The compartments have the same height as those shown in FIGS. 1 and 6. In contrast to the embodiments shown in FIGS. 6, 7, a separate base part 1 and cover part 2 are provided for each of all the compartments. The upper side parts 3d correspond to the side parts in the embodiments shown in FIGS. 1 and 6. The lower side parts 3e have a greater height than the height of the base part 1, and to this extent also extend over the base part 1 of one of the upper compartments. Nevertheless, they have the characteristic of extending over only a single (lower) compartment. A further cover part 2 is provided at the bottom on the right above the compartment, in order to compensate for the increased height.

As can be seen from FIG. 9, the flat on one side of the connecting pieces 16 prevents collisions, in particular with the central two connecting pieces.

FIG. 10 shows a mounting rack with a row of four compartments, which are located alongside one another, for electronics units with a width of ⅜ ATR (3 MCU), whose height is greater than that of the compartments in the mounting racks shown in FIGS. 1, 6 and 8.

The illustrated exemplary embodiments relate to those mounting racks in which the side parts each form a wall which is continuous from top to bottom. This is not intended to represent any restriction. In general, the side parts may be arranged offset as desired with respect to one another from row to row. In contrast, the cover parts and base parts generally form continuous rows (shelf structure); the invention is, however, likewise not restricted to this.

The invention claimed is:

1. A modular aircraft mounting rack, comprising flat rack parts, including base parts, cover parts, side parts and rear parts, and first electrical plug connectors the rack parts being designed such that they can be connected to form a drawer for independent insertion and withdrawal of a an electronics unit which is provided with a second electrical plug, the mounting rack comprising a plurality of drawers wherein at least a first drawer and a second drawer are located alongside one another and wherein one of the side parts is part of both the first drawer and the second drawer together, the drawers each being associated with one of the first electrical plug connectors, such that the first plug connector interacts with the corresponding second plug connector of an electronics unit solely as a result of the insertion of the electronics unit into the drawer, the rack parts being designed such that they can be arranged in rows as required, such that the mounting rack has a predetermined number of drawers which are arranged one above the other and alongside one another, with the rack parts being designed to be detachably connected to one another, wherein the rack parts have dimensions such that the widths or the heights of the drawers are an integer multiples of a module A, and the mounting rack comprises additional rack parts, whose dimensions differ by an integer multiple of a basic module A, with the module A being an integer module of the basic module A, and the rear parts are each designed for connection to the corresponding first plug connector or connectors.

2. A modular aircraft mounting rack, comprising flat rack parts including base parts, cover parts, side parts, rear parts and first electrical plug connectors, the rack parts being designed such that they can be connected to form a drawer for independent insertion and withdrawal of an electronics unit which is provided with a second electrical plug, the mounting rack comprising a plurality of drawers wherein at least a first drawer and a second drawer are located one above the other and wherein side parts of the first drawer and side parts of the second drawer are directly connected to another, the drawers each being associated with one of the first electrical plug connectors such that the first plug connector interacts with the corresponding second plug connector of an electronics unit solely as a result of the insertion of the electronics unit into the drawer, the rack parts being designed such that they can be arranged in rows as required, such that the mounting rack has a predetermined number of drawers which are arranged one above the other and alongside one another, with the rack parts being designed to be detachably connected to one another, wherein the rack parts have dimensions such that the widths or the heights of the drawers are integer multiples of a module A, and the mounting rack comprises additional rack parts whose dimensions differ by an integer multiple of a basic module A, with the module A being an integer module of the basic module A, and the rear parts are each designed for connection to the corresponding first plug connector or connectors.

3. The modular aircraft mounting rack as claimed in claim 2, wherein the widths of at least some of the base parts, the cover parts or of the rear parts correspond to the width of a drawer, and the heights of at least some of the rear parts correspond to the height of a drawer.

4. The modular aircraft mounting rack as claimed in claim 2, 3 or 1, wherein that the drawers each have a width which corresponds to one of the following standard widths:

| Width | | Width [mm] | | Width [inches] | |
|---|---|---|---|---|---|
| [ATR] | [MCU] | Minimum | Maximum | Minimum | Maximum |
| 1/8 | 1 | 25.15 | 25.65 | 0.990 | 1.010 |
| 1/4 | 2 | 56.64 | 57.66 | 2.230 | 2.270 |
| 3/8 | 3 | 89.92 | 90.94 | 3.540 | 3.580 |
| 1/2 | 4 | 123.44 | 124.46 | 4.860 | 4.900 |
| 5/8 | 5 | 156.72 | 157.74 | 6.170 | 6.210 |
| 3/4 | 6 | 190.00 | 191.02 | 7.480 | 7.520 |
| 7/8 | 7 | 222.76 | 223.78 | 8.770 | 8.810 |
| 1 | 8 | 255.78 | 256.80 | 10.070 | 10.110 |
| 1 1/8 | 9 | 288.80 | 289.82 | 11.370 | 11.410 |
| 1 1/4 | 10 | 321.82 | 322.84 | 12.670 | 12.710 |
| 1 3/8 | 11 | 354.84 | 355.86 | 13.970 | 14.010 |
| 1 1/2 | 12 | 387.86 | 388.88 | 15.270 | 15.310 | etc.

5. The modular aircraft mounting rack as claimed in claim 4, wherein the rack parts are made of carbon fiber material.

6. The modular aircraft mounting rack as claimed in claim 2 or 3, wherein the side parts are designed to be connected to one another by means of a tongue and groove connection.

7. The modular aircraft mounting rack as claimed in claim 6, further comprising cooling air chambers which are completely integrated in the rack parts and are each provided with one or more cooling air openings which point into the interior of a drawer.

8. The modular aircraft mounting rack as claimed in claim 2 or 3, further comprising cooling air chambers which are completely integrated in the rack parts and are each provided with one or more cooling air openings which point into the interior of a drawer.

9. The modular aircraft mounting rack as claimed in claim 8, wherein the flat extent of a cooling air chamber corresponds approximately to the dimensions of the corresponding drawer.

10. The modular aircraft mounting rack as claimed in claim 9, wherein each drawer has at least one associated cooling air pressure opening and at least one cooling air suction opening.

11. The modular aircraft mounting rack as claimed in claim 8, wherein each drawer has at least one associated cooling air pressure opening and at least one cooling air suction opening.

12. The modular aircraft mounting rack as claimed in claim 11, wherein the rack parts are made of carbon fiber material.

13. The modular aircraft mounting rack as claimed in claim 8, wherein at least one of the cooling air openings which is associated with a drawer is provided with a metering plate.

14. The modular aircraft mounting rack as claimed in claim 13, wherein the metering plate is connected so as to seal the cooling air opening.

15. The modular aircraft mounting rack as claimed in claim 14, further comprising closure elements designed to allow closing of a predetermined number of metering openings.

16. The modular aircraft mounting rack as claimed in claim 13, further comprising closure elements designed to allow closing of a predetermined number of metering openings in the metering plate.

17. The modular aircraft mounting rack as claimed in claim 8, wherein the rack parts are made of carbon fiber material.

18. The modular aircraft mounting rack as claimed in claim 2, wherein the first plug connectors are parts of adapters.

19. The modular aircraft mounting rack as claimed in claim 2, wherein the rack parts are made of carbon fiber material.

* * * * *